US007277836B2

(12) United States Patent
Netemeyer et al.

(10) Patent No.: US 7,277,836 B2
(45) Date of Patent: Oct. 2, 2007

(54) COMPUTER SYSTEM AND METHOD HAVING A FACILITY NETWORK ARCHITECTURE

(75) Inventors: Stephen C. Netemeyer, Houston, TX (US); Attila D. Banki, Houston, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 715 days.

(21) Appl. No.: 10/016,619

(22) Filed: Dec. 6, 2001

(65) Prior Publication Data

US 2002/0169785 A1 Nov. 14, 2002

Related U.S. Application Data

(60) Provisional application No. 60/258,999, filed on Dec. 29, 2000.

(51) Int. Cl.
*G06G 7/48* (2006.01)
(52) U.S. Cl. ............................................. 703/6; 703/10
(58) Field of Classification Search .................. 703/10, 703/6; 166/250.15
See application file for complete search history.

(56) References Cited

U.S. PATENT DOCUMENTS

| | | | |
|---|---|---|---|
| 3,971,926 A | | 7/1976 | Gau et al. .................... 235/184 |
| 4,901,221 A | | 2/1990 | Kodosky et al. |
| 5,187,788 A | | 2/1993 | Marmelstein |
| 5,256,171 A | | 10/1993 | Payne ............................ 95/19 |
| 5,331,579 A | * | 7/1994 | Maguire et al. ................ 703/2 |
| 5,974,254 A | | 10/1999 | Hsu |
| 5,980,096 A | | 11/1999 | Thalhammer-Reyero |
| 6,002,985 A | * | 12/1999 | Stephenson .................. 702/13 |
| 6,011,917 A | | 1/2000 | Leymann et al. |
| 6,038,389 A | * | 3/2000 | Rahon et al. ................. 703/10 |
| 6,052,520 A | * | 4/2000 | Watts, III ..................... 703/10 |
| 6,063,128 A | | 5/2000 | Bentley et al. ................ 703/6 |

(Continued)

FOREIGN PATENT DOCUMENTS

JP 06-035863 A 10/1994

(Continued)

OTHER PUBLICATIONS

Bjarne Stroustrup, "The C++ Programming Language", 1997, Addison-Wesley Longman Inc., Third Edition, pp. 223-242; 732-748.*

(Continued)

*Primary Examiner*—Paul Rodriguez
*Assistant Examiner*—Jason Proctor

(57) ABSTRACT

The invention relates to a computer system and method for simulating transport phenomena in a complex system. The computer system comprises memory means, storage means, and an object-oriented software product. The software product comprises an object-oriented extensible class hierarchy comprising a first set of generic classes that represent a plurality of object types and a second set of generic classes that represent member variables for the object types. The extensible class hierarchy permits the addition of additional object types or additional member variables without any modifications to the class hierarchy itself. The invention is particularly useful in simulating a hydrocarbon system that may include one or more of the following: a subterranean hydrocarbon-bearing formation, injection wells that penetrate the formation, production wells that penetrate the formation, surface flowlines, associated aquifers, and surface fluid processing facilities.

19 Claims, 7 Drawing Sheets

U.S. PATENT DOCUMENTS

| | | | |
|---|---|---|---|
| 6,064,816 A | 5/2000 | Parthasarathy et al. | |
| 6,108,608 A | 8/2000 | Watts, III | |
| 6,128,577 A | 10/2000 | Assa et al. | 702/2 |
| 6,158,903 A | 12/2000 | Schaeffer et al. | |
| 6,173,438 B1 | 1/2001 | Kodosky et al. | 717/1 |
| 6,266,708 B1 | 7/2001 | Austvold et al. | 709/315 |
| 6,434,435 B1 * | 8/2002 | Tubel et al. | 700/30 |
| 6,442,512 B1 | 8/2002 | Sengupta et al. | 703/6 |
| 6,549,879 B1 | 4/2003 | Cullick et al. | |
| 6,681,383 B1 | 1/2004 | Pastor et al. | 717/126 |
| 6,810,370 B1 | 10/2004 | Watts, III | |
| 6,826,520 B1 | 11/2004 | Khan et al. | |
| 6,842,725 B1 * | 1/2005 | Sarda | 703/10 |
| 6,928,399 B1 | 8/2005 | Watts, III | |
| 7,006,959 B1 | 2/2006 | Huh et al. | |

FOREIGN PATENT DOCUMENTS

| | | |
|---|---|---|
| WO | WO 99/28767 | 10/1999 |
| WO | WO 99/57418 | 11/1999 |

OTHER PUBLICATIONS

Erich Gamma, Richard Helm, Ralph Johnson, John Vlissides; "Design Patterns: Elements of Reusable Object-Oriented Software"; 1995; Addison-Wesley; pp. 107-116.*

J.W. Watts, "Reservoir Simulation: Past, Present, and Future", 1997, Society of Petroleum Engineers, pp. 1-10.*

G. Ferrier and G. Wadge, "An integrated GIS and knowledge-based system as an aid for the geological analysis of sedimentary basins", International Geographical Information Science, (1997), v11, pp. 281-297.

"Joint UK project developing basin geology modelling tool", Offshore Industrial Publications, (1993), pp. 86-87.

P. Kamps & T. Oltshoorn, "Using GIS for hierarchical refinement of MODFLOW models", Application of Geographical Informatin Systems in Hydrology and Water Resources Management, (1996), pp. 535-542.

L. Li, H. C. Chen and J. H. Fang, "XPROS: A Fuzzy Expert System for Prospect Appraisal", Revue de L'Institut Francais du Petrole, (1992), pp. 315-323.

David R. C. Hill, *Object-Oriented Analysis and Simulation*, Addison-Wesley Publishing Company, Harlow, England, (1996), pp. 130-144.

Bergren, F.E., Carruthers, J.E., and Martin, C.; SPE 15095, "A Pattern-Balancing Well Management Routine for Use in the Simulation of Facility Constrained Floods", Apr. 2-4, 1986, pp. 43-51.

Eccles, T.K.; SPE 12275, "A Method of Data Management in a Simulator Used for Large Reservoir Models", Nov. 15-18, 1983, pp. 427-433.

Kendall, R.P., Morrell, G.O., Peaceman, D.W., Silliman, W.J., Watts, J.W.; SPE 11483, "Development of a Multiple Application Reservoir Simulator for Use on a Vector Computer", Mar. 14-17, 1983, pp. 335-348.

Miertschin, J.W., Weiser, A.; SPE19848, "A Flexible Approach to Predictive Well Management Via User-Defined Strategies", Oct. 8-11, 1989, pp. 187-826.

The Math Works, Inc.; "Real Time Workshop"; 1999; *The MathWorks, Inc.*, v.3, pp. I through I-6.

The Math Works, Inc.; "SIMULINK"; 1999; *The MathWorks, Inc.*; v.3, pp. I through I-21.

* cited by examiner

COMPUTER SYSTEM AND METHOD HAVING A FACILITY NETWORK ARCHITECTURE

RELATED U.S. APPLICATION DATA

This application claims priority from provisional application No. 60/258,999 filed on Dec. 29, 2000. Also, this application is related to co-pending U.S. patent application Ser. No. 10/020,033 filed on Dec. 6, 2001, which also claims priority to provisional application No. 60/258,999.

FIELD OF THE INVENTION

This invention relates to numerical simulation, and more specifically relates to an improved method of simulating a hydrocarbon system that may include one or more of the following: a subterranean hydrocarbon-bearing formation, injection wells that penetrate the formation, production wells that penetrate the formation, surface flowlines, associated aquifers, and surface fluid processing facilities.

BACKGROUND OF THE INVENTION

Numerical simulation is widely used in industrial fields as a method of simulating a physical system by using a computer. In most cases, there is desire to model the transport processes occurring in the physical system. What is being transported is typically mass, energy, momentum, or some combination thereof. By using numerical simulation, it is possible to model and observe a physical phenomenon and to determine design parameters, without actual laboratory experiments and field tests.

Reservoir simulation is of great interest because it infers the behavior of a real hydrocarbon-bearing reservoir from the performance of a model of that reservoir. The typical objective of reservoir simulation is to understand the complex chemical, physical, and fluid flow processes occurring in the reservoir sufficiently well to predict future behavior of the reservoir to maximize hydrocarbon recovery. Reservoir simulation often refers to the hydrodynamics of flow within a reservoir, but in a larger sense reservoir simulation can also refer to the total hydrocarbon system which can include not only the reservoir, but also injection wells, production wells, surface flowlines, associated aquifers, and surface processing facilities. Reservoir simulation calculations in such hydrocarbon systems are based on fluid flow through the entire hydrocarbon system being simulated. These calculations are performed with varying degrees of rigor, depending on the requirements of the particular simulation study and the capabilities of the simulation software being used.

The principle of numerical simulation is to numerically solve equations describing a physical phenomenon using a computer. Such equations are generally ordinary differential equations and partial differential equations. As a means for numerically solving such equations, there are known the finite element method, the finite difference method, the finite volume method, and the like. Regardless of which method is used, the physical system to be modeled is divided into cells (a set of which is called a grid or mesh), and the state variables that vary in space throughout the model are represented by sets of values for each cell. The reservoir rock properties such as porosity and permeability are typically assumed to be constant inside a cell. Other variables such as fluid pressure and phase saturation are specified at specified points, sometimes called nodes, within the cell. A link between two nodes is called a "connection."

Since the reservoir simulation can include vastly different fluid flow environments (e.g., porous rock, well tubing, processing facilities), the set of cells can include multiple segments of different flow enviroments. Although individual segments, such as production facilities and surface pipe segments, could be represented by single cells, at times reservoir simulation programs subdivide such segments into multiple cells.

A set of equations is developed to express the fundamental principles of conservation of mass, energy, and/or momentum within each cell and of movement of mass, energy, and/or momentum between cells. These equations can number in the millions. The replacement of state variables that vary in space throughout a model by a finite number of variable values for each cell is called "discretization". In order to analyze a phenomenon changing in time, it is necessary to calculate physical quantities at discrete intervals of time called timesteps, irrespective of the continuously changing conditions as a function of time. Time-dependent modeling of the transport processes therefore proceeds in a sequence of timesteps. The simulation of flow during a desired period of time is done by incrementally moving forward through time, and solving the equations at each timestep for the pressure and fluid contents of every node.

Efforts have been made to perform widely varying reservoir simulation methods in a single computer code. However, such "general-purpose" simulation systems are very complex, largely because they are designed to have one or more of the following capabilities:

(1) represent many different types of cells (e.g., different domains of a reservoir, well tubing, and surface gathering and distribution facilities, and surface processing facilities);

(2) use different timestep computation methods (e.g., IMPES, fully implicit, sequential implicit, adaptive implicit, and/or cascade methods);

(3) use different ways of representing reservoir fluids;

(4) use multiple ways of computing transport between cells;

(5) perform what is called a "black-oil model," which treats the hydrocarbons as being made up of two components, and also having the capability of performing compositional representations in which the hydrocarbons are assumed to contain compounds such as methane, ethane, propane, and heavier hydrocarbons;

(6) simulate steam injection or in situ combustion processes, which must take into account temperature changes as a function of time which require an energy balance and related calculations;

(7) simulate miscible recovery processes using special fluid properties and transport calculations;

(8) simulate hydrocarbon recovery processes that take into account injection of surfactants, polymers, or other chemicals and the flow of these fluids into the reservoir;

(9) simulate injection of chemicals that react with each other, the reservoir hydrocarbons, or the reservoir rock; and

(10) simulate migration of hydrocarbons and geologic deposition over geologic time.

Historically, because general-purpose simulation systems are complex, reservoir simulation programs typically either model only fluid movement in the subsurface reservoir or they model the subsurface fluid movement and include simplified calculations, for example, hydraulics models, to model flow within well tubulars between the reservoir and the surface. To more realistically model the flow through the wells and in attached surface production facilities (such as manifolds, pumps, compressors, separators and pipelines) has typically required a separate facilities simulation model that is distinct from the reservoir simulation model. Since these reservoir and facilities simulation models attempt to describe the flow behavior over a long period of time, typically many years, and the simulations are discretized into timesteps that cover the desired simulation period, it is cumbersome and costly to try to devise an integrated modeling process based on two distinct models. Such a process usually involves alternating timesteps between the two models, such that the changes that occur in one model can be incorporated into the input for the subsequent timestep of the second model.

One challenging problem in reservoir simulation in the past has been the lack of rigorous modeling of transport phenomena through well tubulars and surface facilities within a reservoir simulation system. Conventional reservoir simulators typically have two significant limitations. First, many reservoir management studies require a more sophisticated surface facilities flow model than is possible in a reservoir simulator. To address this problem, the simulator user typically develops and maintains one simulation model for the reservoir behavior and another simulation model for the facilities behavior, with no convenient way to integrate the results from the two models, or to easily evaluate the effects of change in one model on the behavior of the other. Second, reservoir management typically involves dramatic changes in well or facility rates. Since facility rates are used as boundary conditions for reservoir simulation calculations, dramatic changes in those boundary conditions often lead to numerical instabilities in the simulation calculations that are difficult to manage.

Another challenging problem in reservoir simulation is the ability of a simulator user to specify facility management logic in the simulation. To optimize the production of hydrocarbons from a field requires a continuous process to monitor and control the production and injection facilities during the life of the field, which can span up to 30 or more years. To more accurately predict the behavior of the reservoir using a reservoir simulator requires that the impact of surface facility controls be taken into consideration during the simulation. The specific controls, and their sequence and timing, is difficult, if not practically impossible, to program into the simulator because the permutations would be limitless and depend on each field and each simulator user's approach to managing the field. Therefore, the reservoir simulator user needs a tool to be able to specify to the simulator the custom checks and controls that the simulator user believes will optimize the production of the reservoir. Those checks and controls then need to become an integral part of simulator computations. In short, an intuitive tool is needed to capture each simulator user's custom facility management logic, turn that into executable code that is integrated with the reservoir simulator's code, and then execute the resulting system to predict the overall behavior of the reservoir during its lifetime.

The typical approach to this problem has been the development of software that provides a user with a structured capability. The simulator user is provided with a text-based editor or an interface wherein he or she has available a set of constructs and a fixed set of keywords. Using the constructs, the simulator user can define potential conditions, which if met during the simulation, trigger some response that modifies the behavior of the wells. This approach is not very intuitive for the user. The process of assembling the constructs and keywords can be tedious, and the result is not easy to read or interpret, particularly for persons not originally involved with the reservoir project. There is no clear overview of the logic, meaning that it is not easy to follow the high-level line of reasoning behind the logic. The user has limited control over the process and the remedies available for execution are limited by a finite set of combinations that the simulator recognizes, resulting in limited flexibility of the system to accommodate unconventional reservoir management strategies.

There is a need in the industry for a reservoir simulation system that (1) provides a more realistic model of flow through well tubulars and surface facilities and (2) captures a facility management logic customized by a reservoir simulator user and executes it as part of a reservoir simulation.

SUMMARY

The invention relates to a computer system and method for simulating transport phenomena in a complex system. The computer system comprises memory means, storage means, and an object-oriented software product. The software product comprises an object-oriented extensible class hierarchy having generic classes that represent a plurality of object types and separate generic classes that represent member variables for the object types. The extensible class hierarchy permits the addition of additional object types or additional member variables without any modifications to the class hierarchy itself.

The invention is particularly useful in simulating a reservoir system. In applying the invention to a reservoir system model, a facility network model ("FNM") is developed that extends the discretized reservoir simulation model (consisting of nodes and flow connections) beyond the reservoir to include nodes and connections for modeling fluid flow in the well tubulars and surface production and injection facilities (such as manifolds, pumps, compressors, gathering lines, separators and pipelines). Each distinct facility type is modeled as a specialized type of node, connection, or a composite of several nodes and connections. In its most basic form, the entire simulation model can encompass every component of the hydrocarbon field from the subsurface reservoir, all wells and well hardware, and surface facilities up to and including the product delivery outlet(s).

The reservoir simulation system preferably uses facility management logic ("FML") with a reservoir simulator. The FML provides a view of the logic that can be readily used by a user of the simulation method. Use of the FML is flexible and can be integrated with a reservoir simulator. The FML comprises three elements: (1) a Logic Diagram interface, (2) a generator of C++ code (an industry standard programming language) from the Logic Diagram, and (3) a specific software design to integrate the code with the reservoir simulator itself.

BRIEF DESCRIPTION OF THE DRAWINGS

The new reservoir simulation system and its advantages will be better understood by referring to the following detailed description and the attached drawings.

FIG. 3 is part of the class hierarchy shown in FIG. 2.

Figure 1:
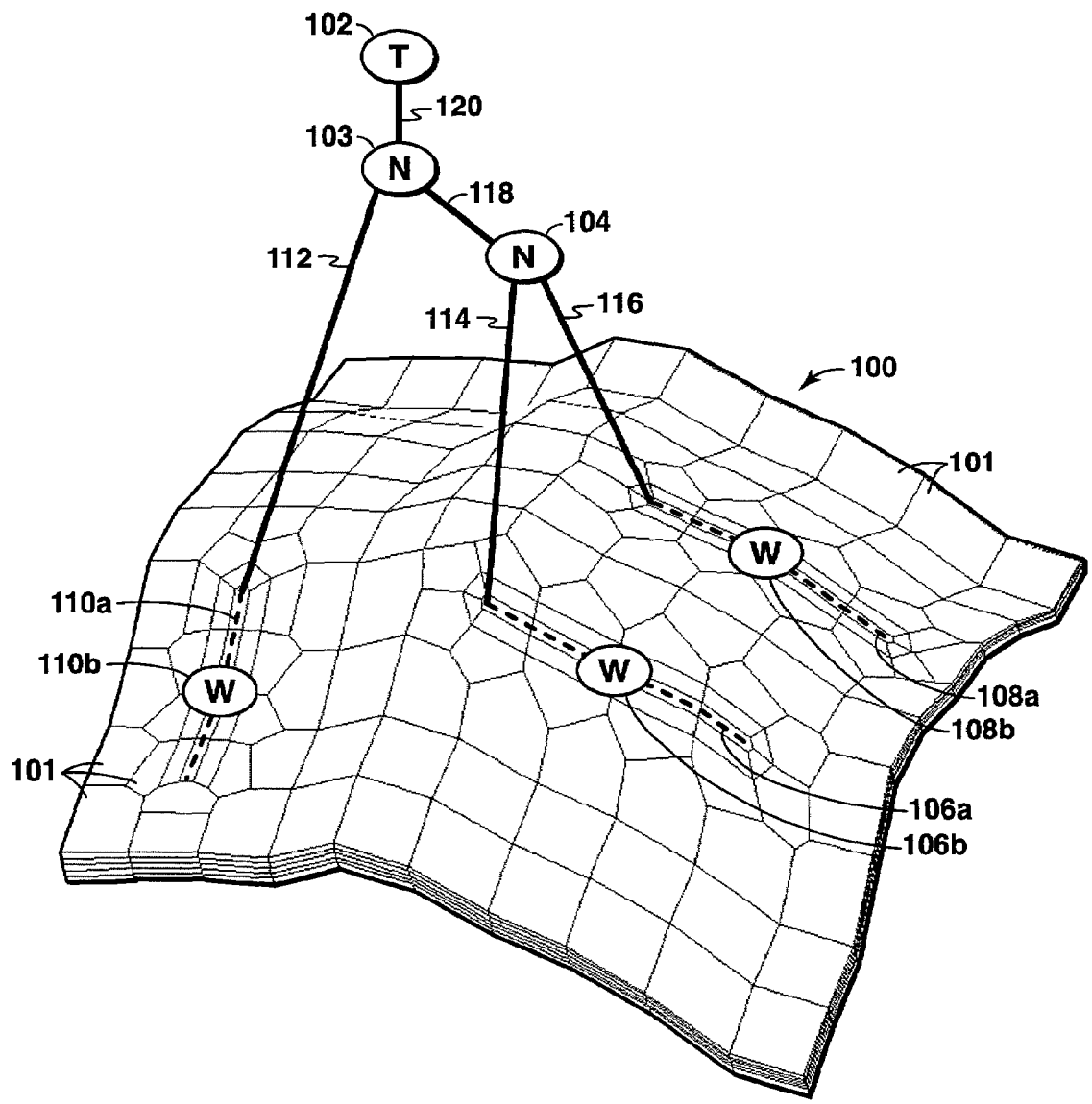
FIG. 1 illustrates a discretized reservoir simulation model and its attached network of wells and surface facilities.

The drawings are not intended to exclude from the scope of the new reservoir simulation system other embodiments that are the result of normal and expected modifications of these specific embodiments.

DETAILED DESCRIPTION

A computer system, having memory means, storage means, and an object-oriented software product of the present invention can be used in simulating complex systems such as two- and three-dimensional domains of the hydrocarbon system that are discretized into structured grids, unstructured grids, or a combination of both. The computer system can also be used in situations in which the computational approach yields a topology having more than three dimensions, such as occurs in simulating fluid flow through fractured porous media. The simulation system is useful in simulating a characteristic of a complex system in which a transport phenomenon is occurring. The term "transport phenomena" is used in this description in a broad sense to include momentum transport (viscous flow), energy transport (heat conduction, convection, and radiation), and mass transport (diffusion). For example, the simulation system is particularly useful to simulate removal of hydrocarbons from reservoir rock using various supplemental recovery techniques such as, but not limited to, thermally-based recovery methods such as steam flooding operations, waterflooding operations, and gas-drive-based methods that can operate under either miscible or immiscible conditions. The simulation system can also be used in modeling contaminant transport through subterranean formations. In this description, the simulation system will be described with respect to performing a general-purpose reservoir simulation on unstructured grid systems, and is especially useful for parallel computing in simulating hydrocarbon-bearing systems, which can include not only the reservoir, but also associated aquifers, production wells, injection wells, surface flowlines, manifolds, separators, valves, pumps, compressors, or any other surface processing or transport facility.

For the purposes of the detailed description of the present invention, several terms are defined to clarify their meaning. A "reservoir simulation model" is a specific mathematical representation of a real hydrocarbon reservoir. An engineer managing a hydrocarbon reservoir may create many different reservoir simulation models, possibly with varying degrees of complexity, in order to quantify the past performance of the reservoir and predict its future performance. In the present invention, a reservoir simulation model is a discretized representation of a reservoir's physical space and the wells and surface facilities that are used in the recovery of hydrocarbon fluids. A "facility" as used in this description is a representation of a tangible piece of physical equipment through which hydrocarbon fluids are either produced from a reservoir or injected into a reservoir. In its broadest sense, the term facility is applied to any equipment that may be present along the flow path between a reservoir and its delivery outlets, which are the locations at which hydrocarbon fluids either leave the model (produced fluids) or enter the model (injected fluids). Facilities may comprise production wells, injection wells, well tubulars, wellhead equipment, gathering lines, manifolds, pumps, compressors, separators, surface flow lines and delivery outlets. In some instances, the term "surface facility" is used to distinguish those facilities other than wells. A "facility network" is the complete collection of facilities that are present in the model, which would include all wells and the surface facilities between the wellheads and the delivery outlets.

A reservoir simulation model comprising a three-dimensional hydrocarbon-bearing reservoir and its associated facilities is illustrated in FIG. 1. The reservoir simulation model schematically illustrated in FIG. 1 is comprised of a discretized reservoir 100, which is penetrated by wells 106a, 108a and 100a, depicted by dashed lines, and containing additional facility nodes 102, 103 and 104 and facility connections 112, 114, 116, 118 and 120. In FIG. 1, the reservoir 100 is depicted as comprising a plurality of volumetric cells 101, delineated by narrow solid lines. Although not explicitly shown in FIG. 1, each cell 101 represents a three dimensional volume of space that contains one node at its center. Also not explicitly shown, each pair of neighboring reservoir nodes has a connection between the corresponding nodes. In the reservoir simulation model, hydrocarbon fluids flow through a connection between a pair of nodes based on the pressure difference between the nodes and the transport properties of the connection. Thus, hydrocarbon fluids can be transported from a volumetric cell to a neighboring volumetric cell. Each well 106a, 108a and 110a contains one node each, 106b, 108b and 110b, respectively. Also not explicitly shown in FIG. 1, each well's node is attached via a connection to each of the reservoir nodes through which the corresponding well's trajectory passes. The facility nodes 103 and 104 and facility connections 112, 114, 116, 118 and 120 represent a gathering network of flowlines that carry fluids produced from reservoir 100 into wells 106a, 108a and 110a to a common delivery point 102.

Object-Oriented Programming

Implementation of the present invention uses object-oriented programming ("OOP") techniques. The most common programming languages for OOP are Simulac® Eiffel™, C++, Smalitalk, Objective-C, or variations thereof. However, the practice of the present invention is not limited to a particular OOP language. C++ is used in this detailed description to help the reader better understand and appreciate the benefits of OOP. The design of OOP is well known to those skilled in the art of OOP systems and will only be described generally.

In an object-oriented program, the focus is primarily on data and secondarily on the functions that access that data, rather than being primarily on functions and secondarily on the data they require. In contrast with a program that is described mainly by procedures with data input to and output from each procedure (such as a program written in FORTRAN or COBOL), an object-oriented program is organized around "objects." An object is a data structure and a set of operations or functions that can access that data structure. OOP systems will typically contain a large number of objects. Each operation (function) that can access the data structure is called a "method." For the purposes of the present invention, the data that an object contains are called "member variables" and the methods that an object has are called "member functions." An object can be considered a smart collection of data, because the object's member functions give the object the ability to make changes to itself, that is, to change the values of its member variables.

A "class" is a template for a specific type of object. The class defines the information associated with the object (its data) and the operations it can perform (its methods). When an object is created, the class is used as a template to define what data and methods the object has. An object is said to be an "instance" of the class that defines it. There can be many distinct objects, all instances of the same class, but each instance has its own data and methods.

A typical object-oriented software design contains at its core a group of classes, which may be referred to collectively as a "data model." A given class in a data model defines one specific type of "object," which can contain data ("member variables") and methods ("member functions"). The data model is a major part of the object-oriented software's "architecture." An object-oriented software product's architecture encompasses the complete design of the software, including the data model around which it is built.

OOP enables objects to model virtually any real-world entity in terms of its characteristics, represented by data, and its behavior, represented by the methods it can perform using the data. In this way, objects can model concrete things like cells in a reservoir simulation and abstract concepts like numbers. For the purposes of the present invention, benefits of OOP arise out of three basic principles: encapsulation, inheritance, and polymorphism.

Objects hide, or encapsulate, the internal structure of their data, i.e., the explicit collection of member variables that an object contains, and the algorithms by which their member functions work. Instead of exposing these implementation details, objects present interfaces that represent their abstracts clearly with no extraneous information. The interface allows only a limited number of interactions between the outside world and an object. In C++ programming, most of these interactions involve invoking member functions of the object. By invoking an object's member functions, the outside world can tell the object to do something, but the details of how the object performs this action are not visible to the outside world. In effect, the object encapsulates its data and methods and hides them from the outside world.

For example, an object-oriented data model for a software system that calculates node properties might have a class called "BaseNode." The BaseNode class could have member variables such as "x_location," "y_location," and "z_location" which hold numeric values to define a BaseNode object's position in space, and member functions to change the value of the BaseNode object's x, y, or z coordinate value. A software system built upon this example data model might contain code to create and modify any number of distinct BaseNode objects. Each BaseNode object contains its own unique values for its member variables, and each has the built-in member functions to modify those member variables. From the perspective of the software system, it does not matter how a BaseNode object maintains its location information. The software system only needs BaseNode member functions to set and retrieve this data. This organization of data (member variables) and code (member functions) into classes is referred to as encapsulation.

Inheritance allows software developers to design the data model in the form of a "class hierarchy," such that related classes mimic the natural classification of object types. The three main benefits of inheritance are that it permits software developers to design code that encapsulates data efficiently, it permits implementation of methods on a specific class so that these methods can be used for objects of many specialized types, and it promotes reuse of pre-existing design and code. In a class hierarchy, general data and methods belong to a "base" class or "superclass." More specialized classes ("subclasses") "inherit" the base class data and methods and define additional data and methods of their own. These specialized classes are "derived" from the base class. Inheritance allows a software developer to define classes and the objects which are later created from them and related through the class hierarchy. Specifically, classes may be designated as subclasses of other base classes. A subclass inherits and has access to all of the functions of its base classes as though such functions appeared in the subclass. Inheritance allows previously written programs to be broadened by creating new superclasses and subclasses of objects. New objects are described by how they differ from preexisting objects so that entirely new programs need not be written to handle new types of data or functions.

For an example of a class hierarchy that illustrates inheritance, extending the previous example of the BaseNode class, a second class called "WellNode" might inherit from the BaseNode class. A WellNode object is both a WellNode and a BaseNode, but the WellNode class can define data and code specific to a WellNode. If a third class "NetworkNode" is defined, that also inherits from BaseNode, but not from WellNode, then a NetworkNode object will not contain the WellNode-specific data or code. However, both a WellNode object and a NetworkNode object will contain BaseNode-specific data and code. This simple example only shows a BaseNode class with one level of additional specialization (the WellNode and NetworkNode classes). However, inheritance permits any number of specialization layers, such that a WellNode class may have further subclasses, and the BaseNode class may have further superclasses.

Polymorphism takes encapsulation a step further. A software component can make a request of another component without knowing exactly what that component is. The component that receives the request interprets it and determines, according to its variables and data, how to execute the request. Using the simple class hierarchy described previously as an example, a software component can invoke a member function of a BaseNode object. The software component does not need to know whether the BaseNode object is actually a WellNode object or a NetworkNode object. However, the class hierarchy enables the WellNode object and the NetworkNode object to contain different implementations of the invoked member function. Each class in the hierarchy may contain the same abstract interface for the member function, but they can have different functionality, appropriate to the specific type of object that executes the member function.

Facility Network Model

Figure 2:
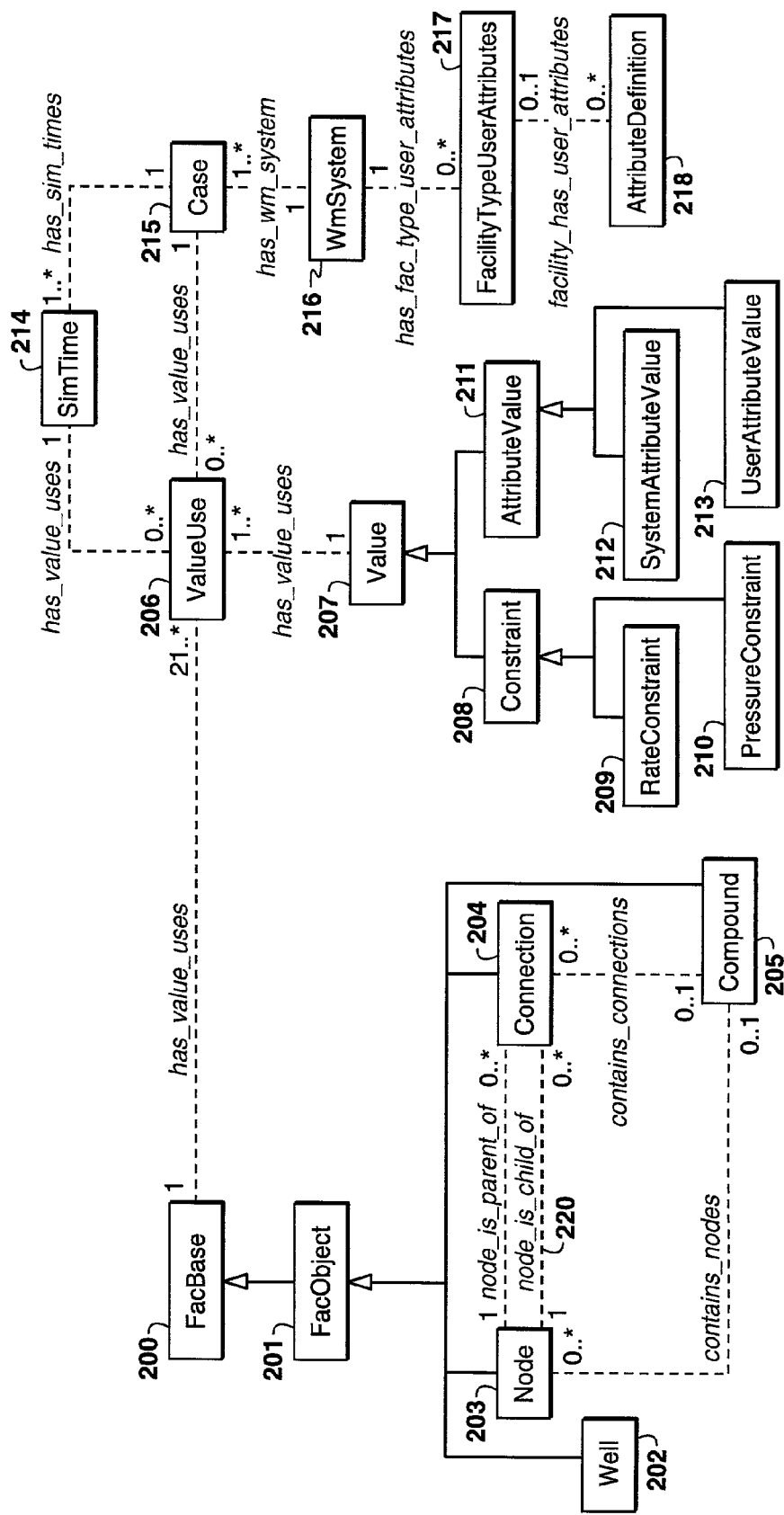
FIGS. 2 and 3 illustrate a generic C++ class hierarchy showing a Facility Network Model.
Figure 3:
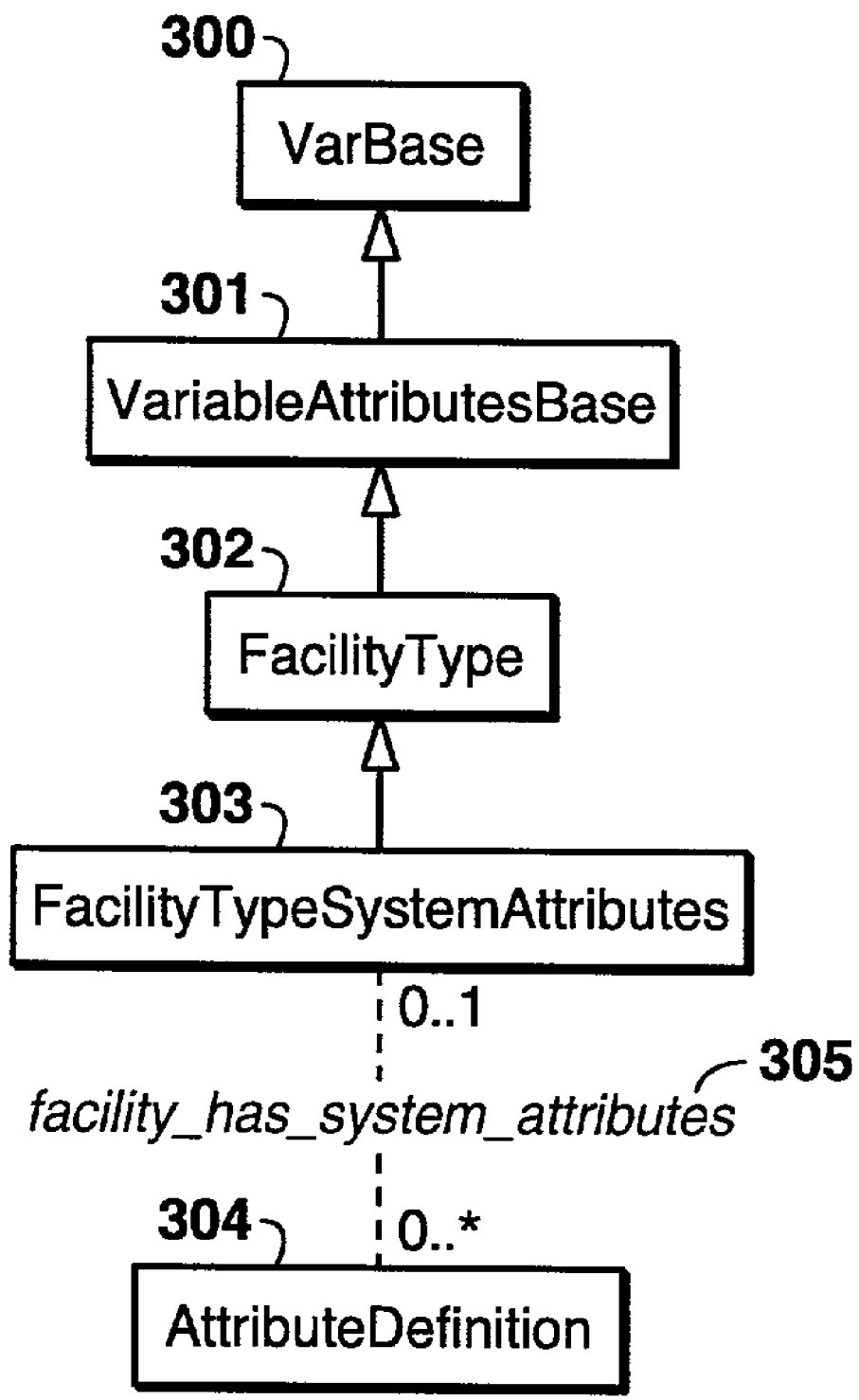

The reservoir simulation system of the present invention includes a Facility Network Model ("FNM"). The FNM is designed to minimize the need for code changes and recompilation. This is achieved by defining generic classes in the FNM C++ class hierarchy. A representative generic C++ class hierarchy is shown in FIGS. 2 and 3. Each box in FIG. 2 (numbered 200 through 218) represents a C++ class. Solid lines between classes with an open triangle at one end indicate inheritance relationships between classes, with the base class at the end with the triangle and the derived class at the opposite end. Dashed lines between two classes represent associations between objects of those two classes. The text labeling a dashed line indicates the name of the association, and the numeric labels at the two ends of each association indicate the cardinality of the association. For example, the association "node_is_child_of" 220 has a "1"

label at the "Node" end and a "0 . . . *" label at the "Connection" end. These labels indicate that every Connection object has exactly 1 Node that is that Connection object's child, and every Node object has zero-or-many Connection objects that the Node object is a child of Each generic class contains only the minimal set of member variables and member functions to define generic behavior for all objects of that class. For example, a generic node class (Node 203 in FIG. 2) is the most specialized type of class in the class hierarchy for all facility types that are modeled by some specialization of a node, whether that node represents a location within a well, surface flow line, a separator, or some other facility that can be represented by a node. Separate generic classes are used to define named "attributes" for specialized facility types (see Attribute Value 211 and its derived classes 212 and 213). Using generic facility type classes (200 through 205) and generic named attribute classes (207 through 213) allows essentially all of the specialized behavior of desired facility types to be defined in a "Definitions Data File" (referred to hereafter as "DDF"). Appendix 6, at the end of this description, sets forth an example of this file. The key design feature of using generic facility and generic attribute classes enables the FNM to be flexible and extensible so that new facility types or new attributes can be incorporated through additions to or modifications of the contents of the DDF. This feature avoids additions or changes to the classes in the data model, which would require significant modifications to source code and recompilation of modified code.

The FNM data model is continued in FIG. 3, which shows a series of classes that keep track of the facility types and attribute types that are defined in the DDF.

The DDF contains text descriptions for each possible facility type, such as "WellNode," "NetworkNode," "SeparatorNode," "Well," and "NetworkConnection." It also contains text descriptions for each of the specialized named attributes for those facility types. When the DDF is processed by the software, it creates a FacilityTypeSystemAttributes object (303) for each specialized facility type in the DDF, and an AttributeDefinition object (304) for each named attribute in the DDF. A FacilityTypeSystemAttributes object inherits from base classes VarBase 300, VariableAttributesBase 301 and FacilityType 302. The facility_has_system_attributes association (305) relates a specific FacilityTypeSystemAttributes object (the definition for a particular facility type) to all of the AttributeDefinition objects (the definition for a specific named attribute) for that facility type. After the DDF has been completely processed, the reservoir simulation system contains objects that define the possible facility types (the collection of FacilityTypeSystemAttributes objects 303) and attributes (the collection of AttributeDefinition objects 304) that each of those facility types must have. The definition of available facility types and named attributes remains constant in the software until the DDF is modified and processed again, which would typically occur only as new facility types or attributes are needed.

The reservoir simulation system using the present invention includes a graphical user interface (GUI) for defining the network of facilities ("Facility Network") that are part of a given simulation model. The GUI displays the Facility Network as a collection of icons that are attached to one another via connection arrows.

Figure 4:
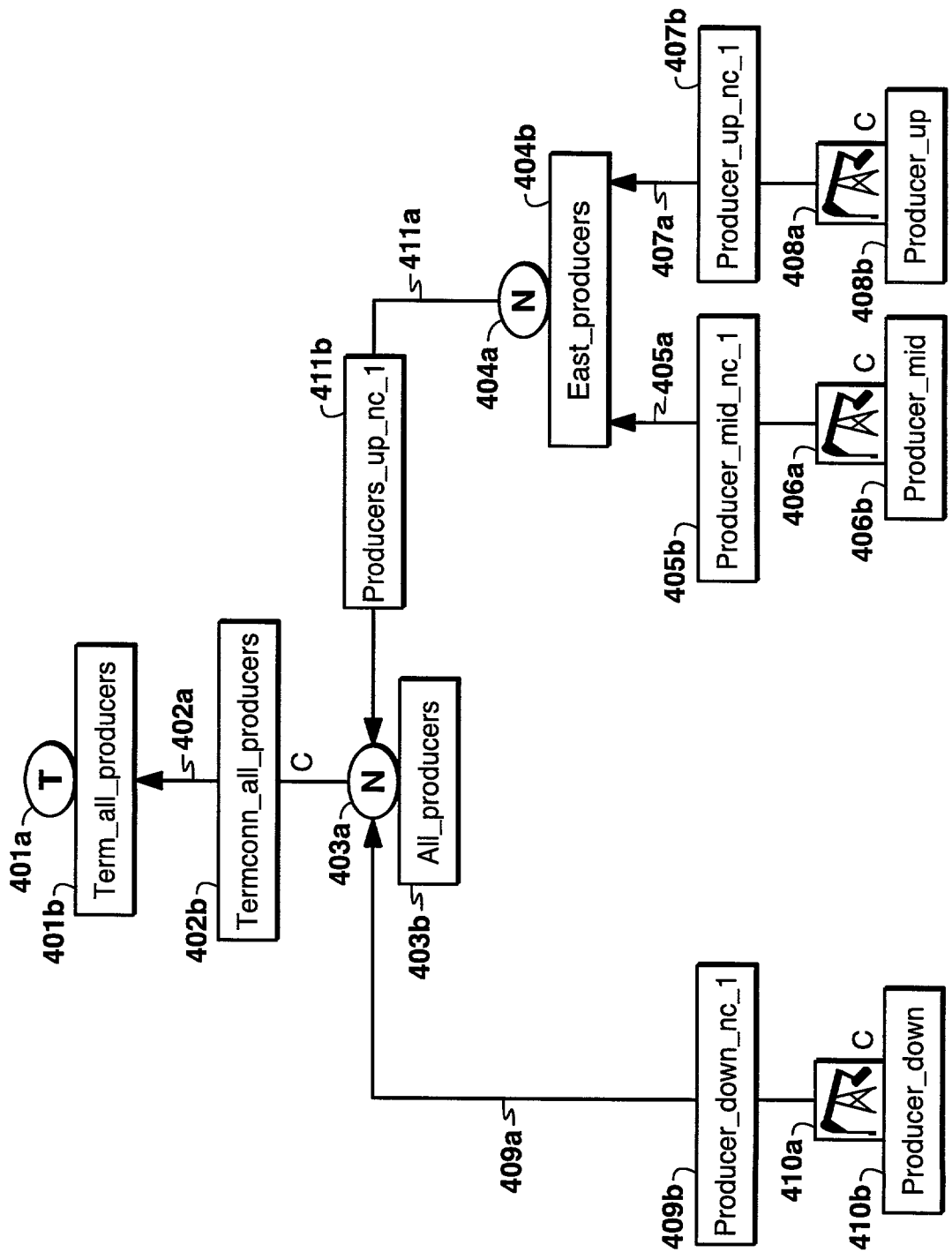
FIG. 4 illustrates a simple facility network as a graphical representation of icons and arrows labeled with the name of the facility that each represents.

FIG. 4 illustrates this graphical user interface for a simple Facility Network. Different icons can be used to represent distinct facility types (wells, separators, network junctions), and the connection arrows represent flowlines between the "node-like" facilities. In FIG. 4, each text box (with "b" suffixes 401b through 410b) indicates the name of a facility depicted by icons or arrows (with "a" suffixes 401a through 410a). The example Facility Network in FIG. 4 contains three wells 406a, 408a, 410a and the surface flow network to which these wells are attached. The surface network contains NetworkNodes 403a and 404a, TerminalNode 401a, NetworkConnections 405a, 407a and 409a, and TerminalConnection 402a. Wells 406a and 408a produce fluids that move to the NetworkNode 404a via the NetworkConnections 405a and 407a. Fluids from Well 410a merge with the production from the other two wells at NetworkNode 403a. From NetworkNode 403a, the fluids continue to the delivery outlet TerminalNode 401a.

The FNM GUI provides custom dialogs, menus, and toolbars so that the user can construct and modify a Facility Network with relative ease. When a user adds a specific facility to the Facility Network for a reservoir simulation study, the reservoir simulation system uses the appropriate FacilityTypeSystemAttributes object 303 (given the type of facility that the user is adding) to locate the set of AttributeDefinition objects (304) which provides the system with the information it needs to create the actual facility object (202, 203, 204 or 205) and all of its system-defined attribute objects (212).

Support of Custom Facility Management Logic

The generic C++ data model for the FNM facilitates the complementary custom Facility Management Logic system ("FML") described below. The FML system is designed for monitoring and controlling the operation of facilities within a running simulation model to optimize the production of hydrocarbons during the life of a field. The FML operates on facility objects during a simulation run that are created from and analogous to the FNM data model objects. To maximize the customizability of the FML, the FNM data model incorporates user-defined named attributes (class UserAttributeValue, 213, FIG. 2). A user can create additional named attributes for any of the available facility types (beyond those that are defined by users in the DDF) and then use those custom named attributes within their custom FML. The definition for a user-defined named attribute is saved as a AttributeDefinition object (218, FIG. 2), and is associated with a FacilityTypeUserAttributes object (217, FIG. 2) that corresponds to the facility type for which the attribute has been defined.

The FNM can be used with any suitable object-oriented programming language. The data model design that includes generic facility types, generic named attributes, and user-defined attributes are not limited to C++ implementation. However, the FNM will preferably use the same object-oriented programming language used in the reservoir simulation program to facilitate compatibility with the other components of the reservoir simulator.

Novel Use of a OOP Class Hierarchy

For the computer system of the present invention, a novel approach has been taken to separate much of the member variables from the objects to which they belong. The class hierarchy encompasses two sub-hierarchies of classes, one sub-hierarchy containing classes to define a variety of "facility types" and the other sub-hierarchy containing classes to define a variety of "attribute values." The two sub-hierarchies reference each other through their respective base classes—the base facility type class (FacBase, 200 in FIG. 2) has an association or reference to the base named attribute value class (Value, 207 in FIG. 2) via the ValueUse class (206, FIG. 2). In the present usage, a facility object will reference many different attribute value objects. Each attribute value object contains a specialized unit of data that helps to define the characteristics of the facility object. Conceptually, the facility is defined by a collection of associated objects—the facility object itself, plus all of its associated attribute value objects. This class architecture does not strictly follow the conventional OOP practice of encapsulation, because a facility's data is not contained fully within a single object. However, the attribute value objects are effectively encapsulated because their access is still provided via methods of the facility object.

A further unique characteristic of the computer system of the present invention is that both the facility type classes and attribute value classes are "generic." Specifically, this means that the most specialized classes in each of the two previously described sub-hierarchies are capable of representing many different, more specialized facility types, and many different attribute values. For example, one type of specialized facility class is Node (203, FIG. 2). This class is generic because Node objects can be instantiated to represent a variety of different node facility types, even though the class hierarchy does not have a distinct specialized node class for each node facility type. Likewise, the SystemAttributeValue (212, FIG. 2) is a generic attribute class because SystemAttributeValue objects can be instantiated to represent a variety of different attribute types, such as floating point scalars, integer scalars, strings, enumerated types, floating point arrays, and integer arrays.

A key advantage of the class hierarchy containing generic facility type and attribute value classes is that the collection of facility types and attribute values supported in the software system can be modified (additional facility types and attribute values defined, or existing ones removed) with no change to the class hierarchy, thereby avoiding the need to recompile source code to accommodate changes to facility types or attribute values. In the current system, clear-text file, for example, an ASCII file, which can be referred to as a "Data Definitions File" contains text entries that define each facility type and all of the attribute values for each facility type. This Data Definitions File is processed by a program to create definitions within the software system. A facility type definition is an object of the FacilityType class (302, FIG. 3). An attribute value definition is an object of the AttributeDefinition class (305, FIG. 3). When a user works with the system to create a simulation model, the definition objects are used by the software whenever the user needs to create an instance of a facility, and its accompanying attribute value instances.

The FNM of the present invention overcomes three challenging problems faced by developers of complex simulation models of subterranean hydrocarbon-bearing reservoirs and associated production facilities:

1. Integration of facility and reservoir fluid-flow calculations, which in the past required models for each that were similar enough to allow for a unified solution approach.
2. The facility fluid-flow calculation model of the present invention is flexible and easily extensible so that the behavior of existing facility types can be extended or additional facility types can be added with relatively minor changes to the software.
3. The facility model architecture supports a system of custom facility management logic, which is desirable to dynamically control the behavior of facilities during a simulation run.

Facility Management Logic

Facility Management Logic ("FML") is a programming system designed for the operational control of a physical system such as wells and associated surface facilities within a reservoir simulation system. The FML comprises three elements: (1) a logic interface, referred to herein as "Logic Diagram", (2) a generator of C++ code (an industry standard programming language) from the Logic Diagram, and (3) a specific software design to integrate the FML code with the reservoir simulator itself.

Logic Diagram

The Logic Diagram comprises a graphical user interface that a simulator user can use to dynamically construct a flow chart of the facility management logic, thereby enabling the user to customize simulation of the physical system being simulated. The ability to dynamically construct logic refers to the user's ability to construct logic as needed to solve facility management problems. Logic can be constructed by the user with the logic interface. The logic interface can be used to perform at least one step chosen from: developing new logic; selecting and using existing logic that either the user or another person previously constructed, perhaps for another facility management problem; selecting and modifying existing logic. The flow chart comprises icons that represent basic logic control constructs and arrows that indicate the progression of logic from one icon to another. The starting point for a Logic Diagram consists of a Start icon (representing the entry point to logic), a Finish icon (representing the exit point from logic) and a single arrow between the two. Arrows have a single direction and they represent the sequence that the icons are evaluated. The user's task is to think through the desired logic, and to model that logic by building up a representative flow chart. All the logic can be in one high-level diagram, or it can be broken up into multiple diagrams, each representing a module of logic. Each module of logic is referred to as an Operation. The MainOperation is the highest-level Operation. A simplified example of such logic is shown in FIG. 5.

Figure 5:
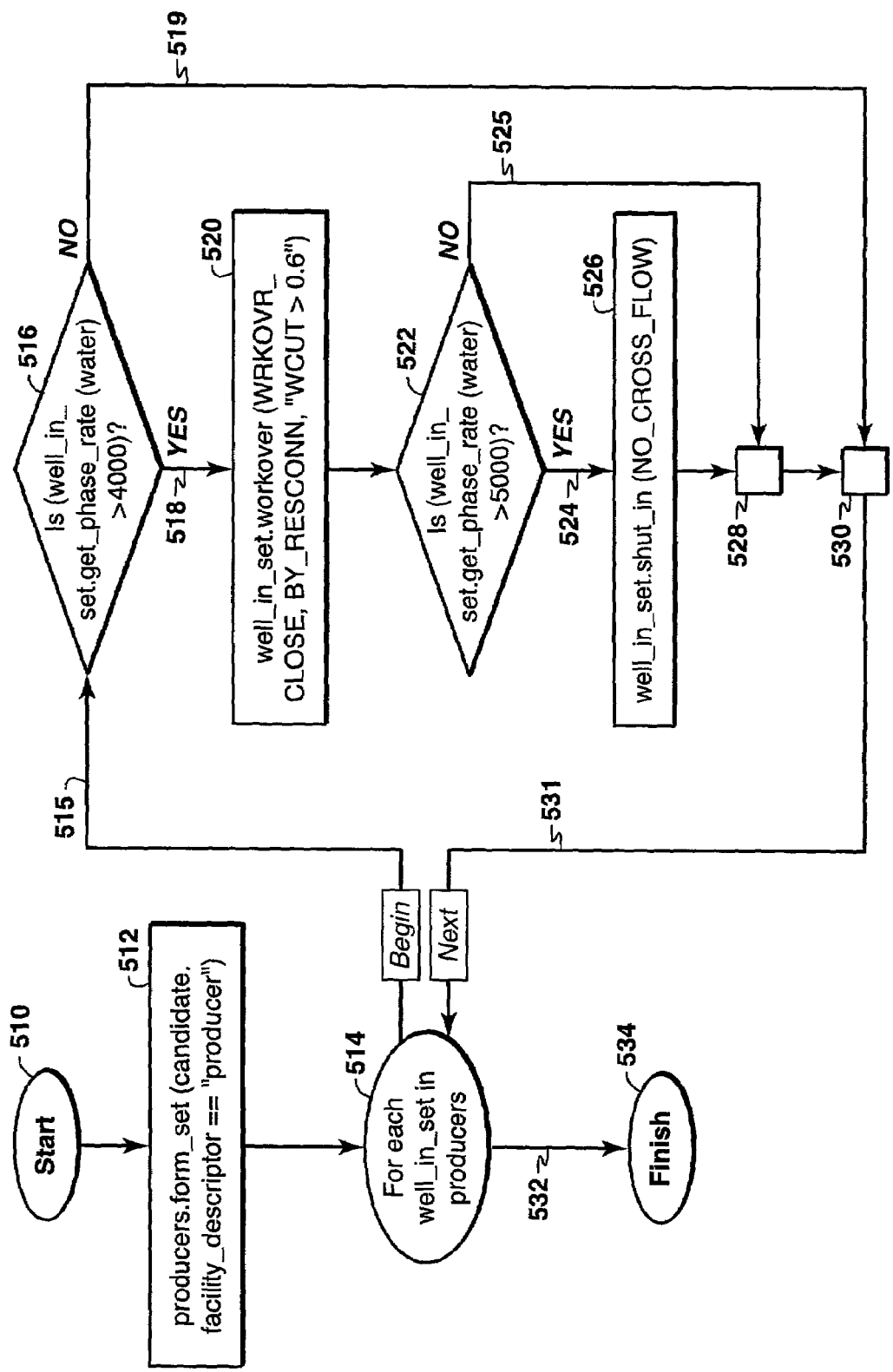
FIG. 5 illustrates a Logic Diagram that shows a simplified facility management logic.

FIG. 5 diagrammatically illustrates one example of a simplified Logic Diagram that shows a simple facility management logic. This logic uses three icon types (three Process icons 512, 520 and 526, two Logical Test icons 516 and 522, and one Loop icon 514). During the course of performing reservoir simulation, this logic is repeatedly executed at regular intervals, each time performing checks and controls on producing wells. Specifically, there is a loop over producing wells (Loop icon 514) which iterates over all members of the set "producers." In the body of the loop (icons 516, 520, 522, 526, 528, 530 and the arrows that connect these icons to each other and to Loop icon 514) the water rate of a specific producing well in set "producers" is checked twice (at Logical Test icons 516 and 522). If the water rate is over 4000 barrels per day at Logical Test icon 516, then the well is worked-over (Process icon 520) in an attempt to reduce the water production. If the water rate is over 5000 barrels per day at Logical Test icon 522, then the well is closed (Process icon 526).

Three types of icons form the building blocks of the flow chart. A Process icon is used to represent equations or calls to operations that act upon facilities to change their state in some way (for instance to open or shut-in a well). A Process icon represents statement execution, and always has a single inward directing arrow and a single outward directing arrow, indicating that there is only one path of execution through the Process icon. A Logical Test icon is used to for decision-making in the flow chart. A Logical Test icon contains a user-specified expression that evaluates to true (yes) or false (no). A Logical Test icon has two out-going arrows, one to be followed if the expression is true (in FIG. 5, arrow 518 for Logical Test icon 516 and arrow 524 for Logical Test icon 522), the other if the expression is false (in FIG. 5, arrow 519 for Logical Test icon 516 and arrow 525 for Logical Test icon 522). A "logical test construct" comprises the Logical Test "icon", and all logic along the Yes and No logic branches up to the end marker of the logical test construct (icon 528 for Logical Test icon 522 and icon 530 for Logical Test icon 516). A Loop icon is used for looping over logic, for example whenever logic must be repeatedly evaluated within the flow chart. The Loop icon contains the logic that controls what type of looping will occur (in FIG. 5, Loop icon 514 is a loop over the members of a set). A "loop construct" is comprised of the Loop icon and all logic icons between the Loop icon's begin arrow (515) and next arrow (531). Often the facility management logic is iterative in nature, and the Loop icon and loop construct are the means to support that concept.

The FML user builds up a flow chart for a desired application in a simulation model by pointing and clicking in a suitable graphical user interface (a Logic Diagram) using a mouse cursor. Using the flow chart displayed in the GUI, the user decides which of the three icon types is needed next, and then activates one of three toolbar buttons by clicking on the desired button. Next, the user moves the cursor over an existing arrow in the flow chart that represents the insertion point for the next icon. When the user selects the arrow by clicking on it, the system inserts the icon and manages the creation and attachment of existing and new arrows.

The simulator user's next task is to populate the inserted icon with information about specifically what the icon should do. For example, if it is a Logical Test icon, then the user defines the expression that is the basis of the true/false test. If it is a Loop icon, then information is needed to specify the basis of the iteration, and how many times the iteration should be done. For a Process icon, the user may need to write an equation or specify the details about how an operation is to be invoked. For each of these tasks, the user can either type information or can make use of a series of context-sensitive menus and dialogs that guide the user through many of the steps needed to build-up the contents of an icon.

A specific syntax is preferred for the way information is specified in each icon. The syntax can be defined by an FML-specific format referred to as Facility Management Control Language. Much of the syntax details are handled automatically when the menus and dialogs are used. If the user is typing the information directly for each icon, then it is the user's responsibility to adhere to the syntax rules. If the user prefers not to work with the graphical Logic Diagram, he or she can alternately work exclusively in a text-based logic code interface (referred to as the Text Mode View) where the user can enter all the Facility Management Control Language directly as text, without the visual aides offered within the FML Logic Diagram view (icons, arrows, menus or dialogs). Once a user begins to work in the Text Mode View, he or she cannot return to the Logic Diagram corresponding to the logic they are specifying.

Appendix 1 at the end of this description contains the text from a Text Mode view of the logic depicted in flow chart form in FIG. 5. The text appearing in Appendix 1 conforms to the Facility Management Control Language syntax. The FML automatically generates this Text Mode view once the user has input the logic using the flow chart view. The user does not need to see or work with this view if he or she does not want to. On the other hand, some users may choose to enter all the logic directly in a Text Mode View, or they may prefer to edit, including entering, modifying or deleting the logic once it is in this form. If they do, then the Logic Diagram view is no longer accessible for this set of logic. As long as the user creates or edits logic using only the Logic Diagram view, the user can switch back and forth between the two views.

Generation of C++ Code

At the point when the logic is complete, and the user is ready to begin the simulation, the system must turn Facility Management Control Language into C++ code so that it can be executed with the simulator. If the Logic Diagram was used, then the system first turns the flow chart into Facility Management Control Language. Conversion of logic to object-oriented code may be performed using any suitable conversion means. This is an automatic step hidden from the user. If the Text Mode was used, then the Facility Management Control Language already in the view is used.

The system then begins a process to parse the Facility Management Control Language to validate the syntax. As the parsing proceeds, syntactically correct and complete pieces of Facility Management Control Language representing the logic is automatically converted into ANSI standard object-oriented C++ code. If syntax errors are found, they are reported. If there are no errors, then the complete set of C++ code is written to a file along with the other simulator input data.

Appendices 2 through 5, located at the end of this description, depict the C++ code generated for the sample logic in FIG. 5 and Appendix 1.

In Appendix 2, the global pointers referring to each facility in the network are declared and initialized. This list varies based on the number and type of facilities in the network, and the facility names specified by the user. The pointers are to the interface classes described in later sections, and in FIGS. 6 and 7.

In Appendix 3, all the global facility pointers shown in Appendix 2 are initialized to point to the actual facility objects in the simulator.

In Appendix 4, at each timestep, the simulator invokes the function named wm_initialize( ). This ensures that the global facility pointers refer to the simulator objects (by calling wm_initialize_globals( ) in Appendix 3), and then it calls the actual facility management logic. The remaining declarations depict one example of dynamic specialization, where the SimWmWellInterface class is specialized as the Functor0 class is declared for the sole purpose of defining a method used to form a set of producing wells. Dynamic specialization is discussed with respect to FIG. 6, discussed in more detail later in this specification.

Appendix 5 lists the C++ code for the facility management logic depicted in FIG. 5 and Appendix 1.

When the main simulator is spawned, it extracts the C++ code from the input file and puts the code into a file for compilation. The main simulator starts the C++ compiler that is native to the platform where the simulator will run, and the compiler then turns the code into an object file. The C++ linker is then started, to create a dynamic link library (on NT) or a shared library (on UNIX). The simulator then loads the library, in preparation to execute the code. At the point the main simulator has loaded the library, the integrated simulation system is created, comprising the main simulator and the custom logic.

At the appropriate point while the integrated simulation system is executing, the simulator calls the C++ code corresponding to the MainOperation, which, as described earlier, either contains all the facility management logic, or calls to other Operations that contain modules of logic. In either case, all the logic is executed, and upon completion, the code returns control back to the simulator. The simulator then continues with its calculations, which are likely impacted by the way in which the logic may have changed the state of the facilities. The simulator then continues to "move forward" in time to estimate the behavior of the reservoir. Regularly throughout this progression, the same facility management logic is executed, thereby continuously effecting the behavior of the field throughout its simulated life. Simulator users can then review the results, and potentially refine the facility management logic or the simulator input data. Ultimately, when the results are acceptable, the facility management logic can form the basis of the actual facility management strategy than will be used in the actual reservoir.

Integration with the Reservoir Simulator

In order for the logic to impact the state of the facilities used by the simulator, it is not enough that the simulator execute the logic. The logic, or more specifically the object oriented C++ code generated from the logic, is integrated with the main simulator's data model. The combination of the main simulation system and the object oriented C++ code which is integrated with the main simulator's data model is collectively known as the integrated simulation system. In order to integrate the object oriented C++ code with the data model, and to make the process more efficient, use is made of object-oriented data modeling techniques, specifically multiple inheritance and polymorphism, and dynamic specialization. The preferred way in which the object-oriented techniques are used will now be described.

Multiple Inheritance and Polymorphism

In order to compile and link the C++ code and integrate it with the simulator, the C++ code must be aware of various aspects of the simulator's data and methods. This is accomplished by "including" files that contain descriptions of the data and methods. These files are referred to as header files. These header files are preferably delivered with the simulator, so that the compiling and linking can be done. As more header files are included in the C++ code, the process of compiling and linking is slowed down. To improve performance, it is preferable to reduce the number of header files and the data they contain. Multiple inheritance and polymorphism is preferably used to accomplish this goal.

A series of empty "interface" objects are created that represent the simulator objects that actually contain the data and methods. This approach is outlined in FIG. 6.

Figure 6:
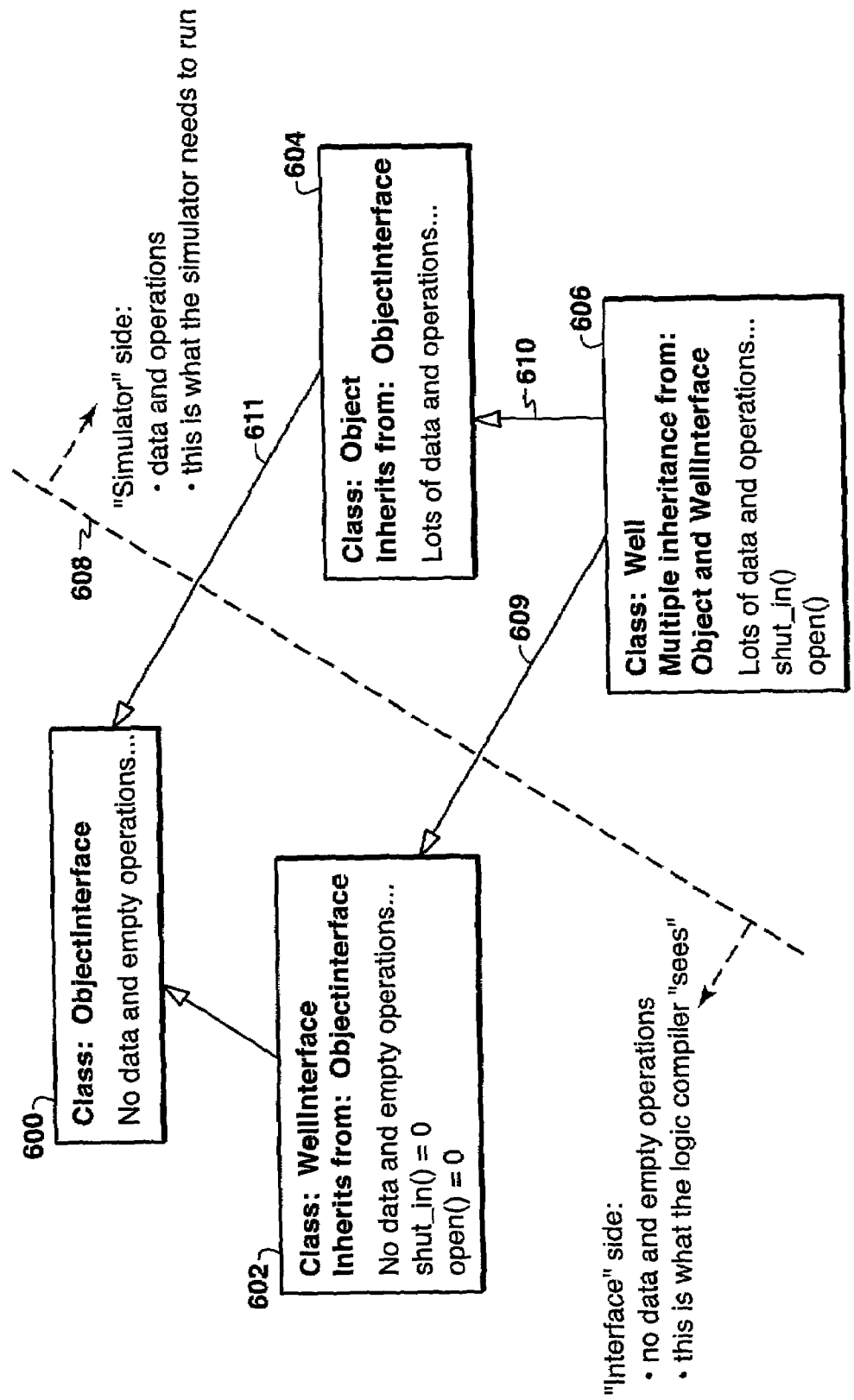
FIG. 6 illustrates a schematic of a small portion of an example simulator class hierarchy.

FIG. 6 schematically illustrates a small portion of the simulator data model. The dashed diagonal line 608 divides "Interface" side classes from "Simulator" side classes. Solid lines with open triangles at one end indicate inheritance relationships, with the base class at the triangle end of the relationship and the derived class at the opposite end. The interface classes 600 and 602 on the left of the dashed line 608 are essentially empty. They contain no member variables and only empty member function declarations ("pure virtual" operations in a C++ implementation of the data model). The interface class WellInterface 602 contains the empty operations "shut_in" and "open". The simulator-side version of Well (606) has the member variables for a Well object and the real implementation for the member functions "shut_in" and "open". Multiple inheritance permits the use and declaration of the interface classes. The simulator-side Well class 606 inherits both from the interface class WellInterface 602 via inheritance arrow 609 and from the simulator class Object 604 via inheritance arrow 610. WellInterface class 602 is a specialization of ObjectInterface 600. Simulator-side base class Object 604 inherits from ObjectInterface class 600 via inheritance arrow 611. Polymorphism permits the empty interface operation "open" to be called on the interface class WellInterface 602, and then to execute the real "open" operation on the actual simulator class Well 606. This same paradigm is used to represent every simulator facility class with a corresponding interface class.

Only the interface objects are needed to be able to compile and link the logic. Since the compiler sees only the simple interface classes, complexity and proprietary information remains hidden from the compiler and from anyone who may be looking at the files. The Facility Management Control Language shown in Appendix 2 contains only interface object pointers, not simulator object pointers. Since the interface objects are empty, the compile/link process is fast, and details about the set of data and methods needed by the simulator are not disclosed (for example to anyone who may be scanning the computer disk for files). Multiple inheritance allows the interface classes to be related to the simulator classes, and polymorphism allows real methods to be invoked indirectly using empty methods declared on the interface classes.

Dynamic Specialization

Each logic Operation developed by a simulator user is associated either with the facility network in general or with a specific facility. The choice is made by the user depending on the nature of the logic. In order for these Operations to be executable within the simulator data model framework already described, the Operations need to become methods of classes. Since C++ does not permit adding methods to existing classes without recompiling the simulator (or significant portions thereof), the methods have to be added to new classes that only the logic code is aware of. This leads to the design wherein at runtime new classes are specialized from the existing interface classes. This approach is schematically shown in FIG. 7.

Figure 7:
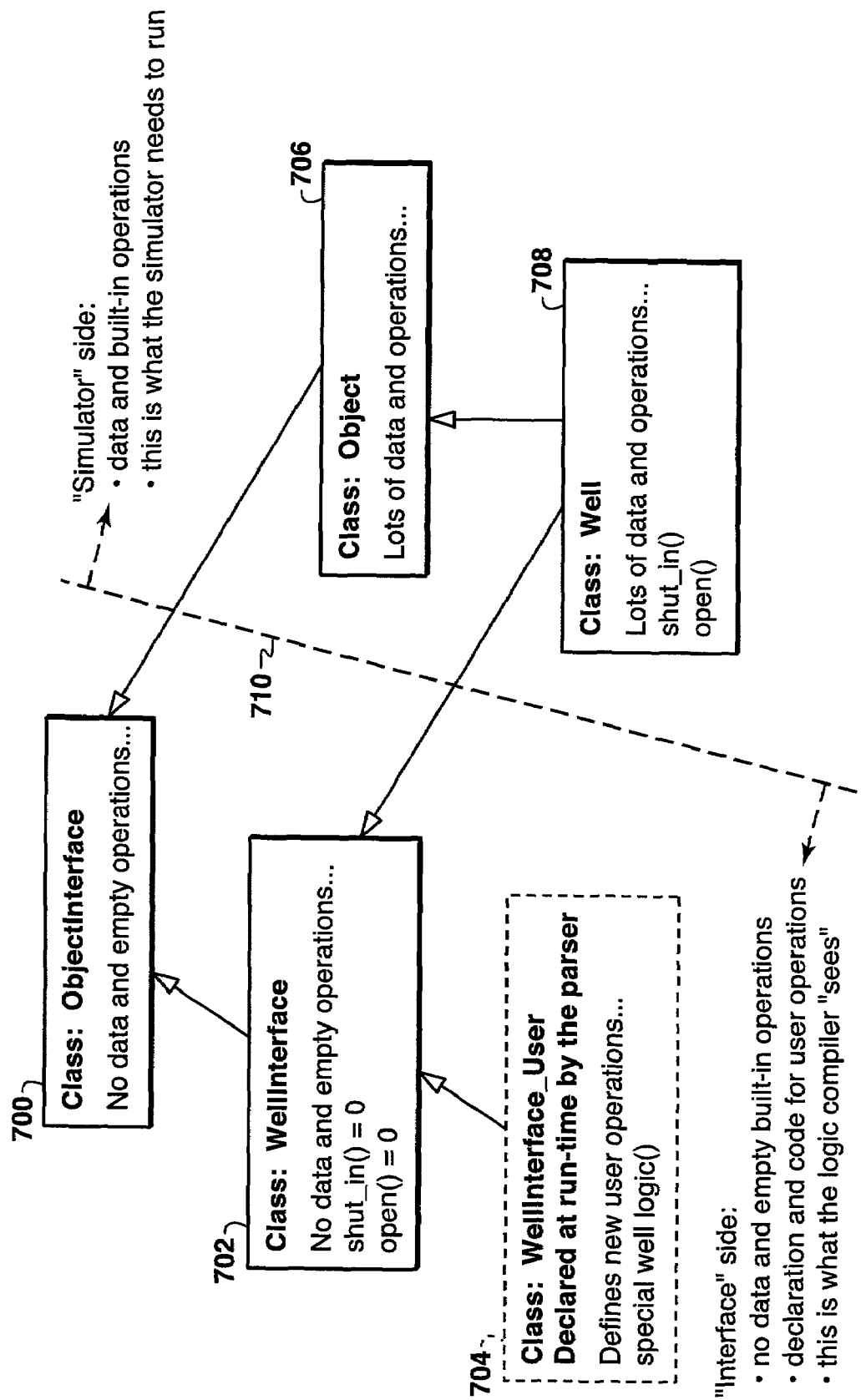
FIG. 7, extending the diagram in FIG. 6, illustrates how dynamic specialization is used to support user-written operations.

FIG. 7, which extends the diagram in FIG. 6, illustrates how dynamic specialization is used to support user-written operations. The diagonal dashed line 710 separates the interface classes 700, 702 and 704 from the simulator classes 706 and 708. Here, the user has written a new operation named "special_well_logic" for facilities of type Well. To support the declaration of new operations, the interface classes are automatically specialized at runtime using class declarations that are written by the Facility Management Control Language-to-C++ parser (hence the term "dynamic specialization"). In this example, the class "WellInterface_User" 704 is created by the parser, and it contains the declaration of and the code comprising the new logic operation. Therefore, both the built-in operations (from WellInterface 702 and ObjectInterface 700) and user operations (from WellInterface_User 704) can be called for facilities that are of type Well.

The data model is extended, but only for the logic code. The rest of the simulator is unaware of the extension, so from the simulator's perspective the data model has not changed, and therefore the simulator code does not have to be compiled in order to use the user-defined logic. Meanwhile, the logic is aware of the new classes and recognizes the new operations. From the user's perspective, built-in operations that the simulator is aware of, and custom operations that the simulator is unaware of, are invoked exactly the same way. Furthermore, the new operations, which belong to classes that are derived from the interface classes, have access to the same built-in operations and data that the interface classes do. The result is an apparent seamless integration between simulator code and custom code.

The FML system can be integrated by persons skilled in the art with a reservoir simulator that uses object-oriented design, preferably coded using C++. The prerequisite for the FML system is that it must be integrated with a simulator that has an object-oriented design.

It is the object-oriented principles that support the concepts of multiple inheritance, polymorphism and class specialization, which are necessary to seamlessly integrate FML with a simulator. The FML can be used with a simulator that is implemented using an object-oriented language other than C++. Other object-oriented programming ("OOP") techniques could be used, including without limitation, Simulac® Eiffel™, Smalltalk, Objective-C, or variations thereof. The practice of FML is not limited to a particular OOP language.

If another OOP system other than C++ is used, the C++ code generation step would need to be revised to generate the alternative OOP language, and this also implies that the simulator would also have an object oriented data model.

The reservoir simulation model having a FML architecture allows the user to develop custom facility management logic to simulate practically any strategy. As such, the permutations of logic are practically infinite.

Flexible and Extensible Data Model Design

The reservoir simulation system preferably also uses object-oriented features of C++ to address the problem of extensibility. The software design preferably uses a collection of C++ classes (referred to collectively as a "data model") to define objects with prescribed data (member variables) and behavior (member functions). The member variables and member functions are hard-coded, that is, they are defined within the classes themselves, meaning that making extensions to the classes; for example, new member variables, new member functions, new classes, requires code changes and recompilation.

In a typical OOP class hierarchy, all member variables for a given class are encapsulated within that class. Therefore, objects that are instances of that class protect and control access to their member variables through their public interfaces, which are the member functions.

The principle of the new reservoir simulation system and the best mode contemplated for applying that principle have been described. It will be apparent to those skilled in the art that various changes may be made to the embodiments described above without departing from the spirit and scope of this reservoir simulation system as described above. It is, therefore, to be understood that this invention is not limited to the specific details shown and described.

Appendix 1

```
// Start of Global Variable Declarations
// End of Global Variable Declarations
wm_main( )
{ // Start of module code
    // Start of Local Variable Declarations
    Set<Well> producers ;
    Ref<Well> well_in_set ;
    // End of Local Variable Declarations
    { // Start of Process icon construct
        producers.form_set (candidate.facility_descriptor == "producer");
    } // End of Process icon construct
    { // Start of loop construct
    foreach well_in_set in producers
    { // Start of loop body
        { // Start of logical test construct
        if ( ( well_in_set.get_phase_rate(WATER) > 4000. ) )
        {
            { // Start of Process icon construct
                well_in_set.workover(WRKOVR_CLOSE, BY_RESCONN,
                    "WCUT>.6");
            } // End of Process icon construct
            { // Start of logical test construct
            if ( ( well_in_set.get_phase_rate(WATER) > 5000. ) )
            {
                { // Start of Process icon construct
                well_in_set.shut_in(NO_CROSS_FLOW);
                } // End of Process icon construct
            }
            else
            {
            }
            } // End of logical test construct
        }
        else
        {
        }
        } // End of logical test construct
```

Appendix 1-continued

```
    } // End of loop body
  } // End of loop construct
{
return ;
}
} // End of module code
```

Appendix 2

```
#include "q:\rell_sim\bin\runtime_includes\wm_headers.h"
SimWmWellNodeInterface* wellnode_potnorth = NULL;
SimWmWellNodeInterface* wellnode_potsouth = NULL;
SimWmWellNodeInterface* wellnode_prod100 = NULL;
SimWmWellNodeInterface* wellnode_prod82 = NULL;
SimWmNetworkNodeInterface* netnode_injector = NULL;
SimWmNetworkNodeInterface* netnode_producer = NULL;
SimWmTerminalNodeInterface* termnode_injector = NULL;
SimWmTerminalNodeInterface* termnode_producer = NULL;
SimWmReservoirConnectionInterface* potnorth_rc_0 = NULL;
SimWmReservoirConnectionInterface* potnorth_rc_1 = NULL;
SimWmReservoirConnectionInterface* potnorth_rc_2 = NULL;
SimWmReservoirConnectionInterface* potsouth_rc_0 = NULL;
SimWmReservoirConnectionInterface* potsouth_rc_1 = NULL;
SimWmReservoirConnectionInterface* potsouth_rc_2 = NULL;
SimWmReservoirConnectionInterface* prod100_rc_0 = NULL;
SimWmReservoirConnectionInterface* prod100_rc_1 = NULL;
SimWmReservoirConnectionInterface* prod100_rc_2 = NULL;
```

Appendix 2-continued

```
SimWmReservoirConnectionInterface* prod82_rc_0 = NULL;
SimWmReservoirConnectionInterface* prod82_rc_1 = NULL;
SimWmReservoirConnectionInterface* prod82_rc_2 = NULL;
SimWmTerminalConnectionInterface* termconn_injector = NULL;
SimWmNetworkConnectionInterface* netconn_potnorth = NULL;
SimWmNetworkConnectionInterface* netconn_potsouth = NULL;
SimWmNetworkConnectionInterface* netconn_prod100 = NULL;
SimWmTerminalConnectionInterface* termconn_producer = NULL;
SimWmNetworkConnectionInterface* netconn_prod82 = NULL;
SimWmWellInterface* potnorth = NULL;
SimWmWellBranchInterface* wellbranch1 = NULL;
SimWmWellInterface* potsouth = NULL;
SimWmWellBranchInterface* wellbranch2 = NULL;
SimWmWellInterface* prod100 = NULL;
SimWmWellBranchInterface* wellbranch3 = NULL;
SimWmWellInterface* prod82 = NULL;
SimWmWellBranchInterface* wellbranch4 = NULL;
```

Appendix 3

```
void wm_initialize_globals( )
{
    static int wmig_was_called = 0;
    if (wmig_was_called)
        return;
    wmig_was_called = 1;
    wellnode_potnorth = (SimWmWellNodeInterface*)
            SimWmFNControllerUtility::lookup_object("wellnode_potnorth",
            VM_GetInterfaceID<SimWmWellNodeInterface>( ) ( ) );
    wellnode_potsouth = (SimWmWellNodeInterface*)
            SimWmFNControllerUtility::lookup_object ("wellnode_potsouth",
            VM_GetInterfaceID<SimWmWellNodeIntertace>( ) ( ) );
    wellnode_prod100 = (SimWmWellNodeInterface*)
            SimWmFNControllerUtility::lookup_object ("wellnode_prod100",
            VM_GetInterfaceID<SimWmWellNodeInterface>( ) ( ) );
    wellnode_prod82 = (SimWmWellNodeInterface*)
            SimWmFNControllerUtility::lookup_object ("wellnode_prod82",
            VM_GetInterfaceID<SimWmWellNodeInterface>( ) ( ) );
    netnode_injector = (SimWmNetworkNodeInterface*)
            SimWmFNControllerUtility::lookup_object ("netnode_injector",
            VM_GetInterfaceID<SimWmNetworkNodeInterface>( ) ( ) );
    netnode_producer = (SimWmNetworkNodeInterface*)
            SimWmFNControllerUtility::lookup_object ("netnode_producer",
            VM_GetInterfaceID<SimWmNetworkNodeInterface>( ) ( ) );
    termnode_injector = (SimWmTerminalNodeInterface*)
            SimWmFNControllerUtility::lookup_object ("termnode_injector",
            VM_GetInterfaceID<SimWmTerminalNodeInterface>( ) ( ) );
    termnode_producer = (SimWmTerminalNodeInterface*)
            SimWmFNControllerUtility::lookup_object ("termnode_producer",
            VM_GetInterfaceID<SimWmTerminalNodeInterface>( ) ( ) );
    potnorth_rc_0 = (SimWmReservoirConnectionInterface*)
            SimWmFNControllerUtility::lookup_object ("potnorth_rc_0",
            VM_GetInterfaceID<SimWmReservoirConnectionInterface>( ) ( ) );
```

Appendix 3-continued

```
potnorth_rc_1 = (SimWmReservoirConnectionInterface*)
        SimWmFNControllerUtility::lookup_object ("potnorth_rc_1",
        VM_GetInterfaceID<SimWmReservoirConnectionInterface>( ) ( ) );
potnorth_rc_2 = (SimWmReservoirConnectionInterface*)
        SimWmFNControllerUtility::lookup_object ("potnorth_rc_2",
        VM_GetInterfaceID<SimWmReservoirConnectionInterface>( ) ( ) );
potsouth_rc_0 = (SimWmReservoirConnectionInterface*)
        SimWmFNControllerUtility::lookup_object ("potsouth_rc_0",
        VM_GetInterfaceID<SimWmReservoirConnectionInterface>( ) ( ) );
potsouth_rc_1 = (SimWmReservoirConnectionInterface*)
        SimWmFNControllerUtility::lookup_object ("potsouth_rc_1",
        VM_GetInterfaceID<SimWmReservoirConnectionInterface>( ) ( ) );
potsouth_rc_2 = (SimWmReservoirConnectionInterface*)
        SimWmFNControllerUtility::lookup_object ("potsouth_rc_2",
        VM_GetInterfaceID<SimWmReservoirConnectionInterface>( ) ( ) );
prod100_rc_0 = (SimWmReservoirConnectionInterface*)
        SimWmFNControllerUtility::lookup_object ("prod100_rc_0",
        VM_GetInterfaceID<SimWmReservoirConnectionInterface>( ) ( ) );
prod100_rc_1 = (SimWmReservoirConnectionInterface*)
        SimWmFNControllerUtility::lookup_object ("prod100_rc_1",
        VM_GetInterfaceID<SimWmReservoirConnectionInterface>( ) ( ) );
prod100_rc_2 = (SimWmReservoirConnectionInterface*)
        SimWmFNControllerUtility::lookup_object ("prod100_rc_2",
        VM_GetInterfaceID<SimWmReservoirConnectionInterface>( ) ( ) );
prod82_rc_0 = (SimWmReservoirConnectionInterface*)
        SimWmFNControllerUtility::lookup_object ("prod82_rc_0",
        VM_GetInterfaceID<SimWmReservoirConnectionInterface>( ) ( ) );
prod82_rc_1 = (SimWmReservoirConnectionInterface*)
        SimWmFNControllerUtility::lookup_object ("prod82_rc_1",
        VM_GetInterfaceID<SimWmReservoirConnectionInterface>( ) ( ) );
prod82_rc_2 = (SimWmReservoirConnectionInterface*)
        SimWmFNControllerUtility::lookup_object ("prod82_rc_2",
        VM_GetInterfaceID<SimWmReservoirConnectionInterface>( ) ( ) );
termconn_injector = (SimWmTerminalConnectionInterface*)
        SimWmFNControllerUtility::lookup_object ("termconn_injector",
        VM_GetInterfaceID<SimWmTerminalConnectionInterface>( ) ( ) );
netconn_potnorth = (SimWmNetworkConnectionInterface*)
        SimWmFNControllerUtility::lookup_object ("netconn_potnorthnorth",
        VM_GetInterfaceID<SimWmNetworkConnectionInterface>( ) ( ) );
netconn_potsouth = (SimWmNetworkConnectionInterface*)
        SimWmFNControllerUtility::lookup_object ("netconn_potsouth",
        VM_GetInterfaceID<SimWmNetworkConnectionInterface>( ) ( ) );
netconn_prod100 = (SimWmNetworkConnectionInterface*)
        SimWmFNControllerUtility::lookup_object ("netconn_prod100",
        VM_GetInterfaceID<SimWmNetworkConnectionInterface>( ) ( ) );
termconn_producer = (SimWmTerminalConnectionInterface*)
        SimWmFNControllerUtility::lookup_object ("termconn_producer",
        VM_GetInterfaceID<SimWmTerminalConnectionInterface>( ) ( ) );
netconn_prod82 = (SimWmNetworkConnectionInterface*)
        SimWmFNControllerUtility::lookup_object ("netconn_prod82",
        VM_GetInterfaceID<SimWmNetworkConnectionInterface>( ) ( ) );
potnorth = (SimWmWellInterface*)
        SimWmFNcontrollerUtility::lookup_object ("potnorth",
        VM_GetInterfaceID<SimWmWellInterface>( ) ( ) );
wellbranch1 = (SimWmWellBranchInterface*)
        SimWmFNControllerUtility::lookup_object ("wellbranch1",
        VM_GetInterfaceID<SimWmWellBranchInterface>( ) ( ) );
potsouth = (SimWmWellInterface*)
        SimWmFNControllerUtility::lookup_object ("potsouth",
        VM_GetInterfaceID<SimWmWellInterface>( ) ( ) );
wellbranch2 = (SimWmWellBranchInterface*)
        SimWmFNControllerUtility::lookup_object ("wellbranch2",
        VM_GetInterfaceID<SimWmWellBranchInterface>( ) ( ) );
prod100 = (SimWmWellInterface*)
        SimWmFNControllerUtility::lookup_object ("prod100",
        VM_GetInterfaceID<SimWmWellInterface>( ) ( ) );
wellbranch3 = (SimWmWellBranchInterface*)
        SimWmFNControllerUtility::lookup_object ("wellbranch3",
        VM_GetInterfaceID<SimWmWellBranchInterface>( ) ( ) );
prod82 = (SimWmWellInterface*)
        SimWmFNControllerUtility::lookup_object ("prod82",
        VM_GetInterfaceID<SimWmWellInterface>( ) ( ) );
wellbranch4 = (SimWmWellBranchInterface*)
        SimWmFNControllerUtility::lookup_object ("wellbranch4",
        VM_GetInterfaceID<SimWmWellBranchInterface>( ) ( ) );
```

Appendix 4

```
void wm_main ( );
extern "C" {
void wm_initialize ( )
{
    wm_initialize_globals( );
    wm_main ( );
}
}
class Functor0 : public Selector<SimWmWellInterface>
{
public:
    Functor0 ( );
    virtual ~Functor0 ( );
    virtual Bool operator( ) (SimWmWellInterface* candidate) const;
};
Functor0::Functor0 ( )
{
    // do nothing else
}
Functor0::~Functor0 ( )
{
    // do nothing else
}
Bool Functor0::operator( ) (SimWmWellInterface* candidate) const
{
    return (*((String*) (candidate-
    >lookup_attribute ("facility_descriptor", 0,
        TYPE_String))) == "producer");
}
```

Appendix 5

```
void wm_main( )
{
    Set<SimWmWellInterface> producers;
    SimWmWellInterface* well_in_set = NULL;
    {
        producers. form_set (new Functor0 ( ) );
    }
    {
        producers.reset( );
        while (producers.get_next(well_in_set) )
        {
            PhaseTypeEnum scratch___0 = (PhaseTypeEnum) (WATER);
            if ( (well_in_set->get_phase_rate
            (scratch___0) > 4000.) )
            {
                {
                    WorkoverTypeEnum scratch___1 = (WorkoverTypeEnum) (WRKOVR_CLOSE);
                    WorkoverLevelTypeEnum scratch___2 =
                        (WorkoverLevelTypeEnum) (BY_RESCONN);
                    String scratch___3 = "WCUT>.6";
                    well_in_set->workover
                    (scratch___1, scratch___2, scratch___3);
                }
                {
                    PhaseTypeEnum scratch___4 = (PhaseTypeEnum) (WATER);
                    if ( (well_in_set->get_phase_rate
                    (scratch___4) > 5000.) )
                    {
                        ShutInTypeEnum scratch___5 = ShutInTypeEnum) (NO_CROSS_FLOW);
                        well_in_set->shut_in(scratch___5);
                    }
                    else
                    {
                    }
                }
            }
            else
            {
            }
        }
    }
    return;
}
```

Appendix 6

This excerpt from the Data Definitions File illustrates the hierarchical nature of facility type definitions and named attribute definitions. The facility types included in this excerpt demonstrate the base facility type levels needed to define the end-user facility type "NetworkNode." The excerpt includes the definitions for three named attributes that a NetworkNode would have. Two of the named attributes are defined at the FacObject level and the third is defined at the Node level.

```
// Comments in the Data Definitions File begin with "//"
// "\" at the end of a line indicates continuation on the subsequent line
// Highest level base facility type is FacBase
Name:                                   "FacBase"
    Definition:                         "FacBase Definition"
    Is Obsolete:                        F
    IOArchive Class Name:               "NA"
    Long Name:                          "FacBase"
    View Name:                          "View Name"
    Decomp Hierarchy:                   ""
    Dimensionality:                     ""
    Req by Restart Rule:                "restart rule"
    Req by Simulator Rule:              "simulator rule"
    Req by User Rule:                   "user rule"
    Valid Rule:                         "valid rule"
    Bitmap Resource ID:                 0
    Instantiable:                       F
    Member of Granule:                  F
    Simulator Variable:                 F
    Time Variant:                       F
    Decomposable:                       F
    Spec for all Nodes:                 F
    Change Invalidates:                 F
    Parent Facility:                    ""
    Is Abstract:                        T
// Parent type of FacObject is FacBase
Name:                                   "FacObject"
    Definition:                         "FacObject Definition"
    Is Obsolete:                        F
    IOArchive Class Name:               "NA"
    Long Name:                          "FacObject"
    View Name:                          "View Name"
    Decomp Hierarchy:                   ""
    Dimensionality:                     ""
    Req by Restart Rule:                "restart rule"
    Req by Simulator Rule:              "simulator rule"
    Req by User Rule:                   "user rule"
    Valid Rule:                         "valid rule"
    Bitmap Resource ID:                 0
    Instantiable:                       F
    Member of Granule:                  F
    Simulator Variable:                 F
    Time Variant:                       F
    Decomposable:                       F
    Spec for all Nodes:                 F
    Change Invalidates:                 F
    Parent Facility:                    "FacBase"
    Is Abstract:                        T
        // is_active is a named attribute defined at the FacObject level
        Attribute Name:                 "is_active"
            Description:                "is_active"
            Unit Group Name:            ""
            Default Value:              "TRUE"
            Enum Type:                  ""
            Is Array:                   F
            Is Fixed Length:            T
            Number of Values:           1
            Dimensionality:             ""
            Attribute Type:             BOOL
            Is Class Attribute:         F
            Is Visible to User:         F
```

Appendix 6-continued

This excerpt from the Data Definitions File illustrates the hierarchical nature of facility type definitions and named attribute definitions. The facility types included in this excerpt demonstrate the base facility type levels needed to define the end-user facility type "NetworkNode." The excerpt includes the definitions for three named attributes that a NetworkNode would have. Two of the named attributes are defined at the FacObject level and the third is defined at the Node level.

```
                Is Time Variant:              T
                Is Results Only:              F
                Is Used by Simulator:         T
        // facility_descriptor is a named attribute defined at the
    FacObject level
            Attribute Name:                   "facility_descriptor"
                    Description:              "User-defined string that can
    be used" /
                                              " to logically group this
    facility" /
                                              "with similar facilities"
                Unit Group Name:              ""
                Default Value:                ""
                Enum Type:                    ""
                Is Array:                     F
                Is Fixed Length:              T
                Number of Values:             1
                Dimensionality:               ""
                Attribute Type:               STRING
                Is Class Attribute:           F
                Is Visible to User:           T
                Is Time Variant:              T
                Is Results Only:              F
                Is Used by Simulator:         T
// Parent type of Node is FacObject
Name:                                         "Node"
    Definition:                               "Node Definition"
    Is Obsolete:                              F
    IOArchive Class Name:                     "NA"
    Long Name:                                "Node"
    View Name:                                "View Name"
    Decomp Hierarchy:                         ""
    Dimensionality:                           ""
    Req by Restart Rule:                      "restart rule"
    Req by Simulator Rule:                    "simulator rule"
    Req by User Rule:                         "user rule"
    Valid Rule:                               "valid rule"
    Bitmap Resource ID:                       0
    Instantiable:                             F
    Member of Granule:                        F
    Simulator Variable:                       F
    Time Variant:                             F
    Decomposable:                             F
    Spec for all Nodes:                       F
    Change Invalidates:                       F
    Parent Facility:                          "FacObject"
    Is Abstract:                              T
        // depth_node is a named attribute defined at the Node level
            Attribute Name:                   "depth_node"
                Description:                  "Depth of the node"
                Unit Group Name:              "Depths"
                Default Value:                "0.0"
                Enum Type:                    ""
                Is Array:                     F
                Is Fixed Length:              T
                Number of Values:             1
                Dimensionality:               ""
                Attribute Type:               FLOAT
                Is Class Attribute:           F
                Is Visible to User:           T
                Is Time Variant:              T
                Is Results Only:              F
                Is Used by Simulator:         T
// Parent type of GeneralFacilityNode is Node. Note that the FNM C++
data model
// does not contain this class - it is only defined in the Data
Definitions File.
Name:                                         "GeneralFacilityNode"
    Definition:                               "generic class used to represent most
facility types"
    Is Obsolete:                              F
    IOArchive Class Name:                     "NA"
```

Appendix 6-continued

This excerpt from the Data Definitions File illustrates the hierarchical nature of facility type definitions and named attribute definitions. The facility types included in this excerpt demonstrate the base facility type levels needed to define the end-user facility type "NetworkNode." The excerpt includes the definitions for three named attributes that a NetworkNode would have. Two of the named attributes are defined at the FacObject level and the third is defined at the Node level.

```
    Long Name:                    "GeneralFacilityNode"
    View Name:                    "View Name"
    Decomp Hierarchy:             ""
    Dimensionality:               ""
    Req by Restart Rule:          "restart rule"
    Req by Simulator Rule:        "simulator rule"
    Req by User Rule:             "user rule"
    Valid Rule:                   "valid rule"
    Bitmap Resource ID:           0
    Instantiable:                 F
    Member of Granule:            F
    Simulator Variable:           F
    Time Variant:                 F
    Decomposable:                 F
    Spec for all Nodes:           F
    Change Invalidates:           F
    Parent Facility:              "Node"
    Is Abstract:                  T
// Parent type of NetworkNode is GeneralFacilityNode. Note that the FNM C++ data
// model does not contain this class - it is only defined in the Data Definitions
// File.
Name:                             "NetworkNode"
    Definition:                   "NetworkNode Definition"
    Is Obsolete:                  F
    IOArchive Class Name:         "NA"
    Long Name:                    "NetworkNode"
    View Name:                    "View Name"
    Decomp Hierarchy:             ""
    Dimensionality:               ""
    Req by Restart Rule:          "restart rule"
    Req by Simulator Rule:        "simulator rule"
    Req by User Rule:             "user rule"
    Valid Rule:                   "valid rule"
    Bitmap Resource ID:           0
    Instantiable:                 F
    Member of Granule:            F
    Simulator Variable:           F
    Time Variant:                 F
    Decomposable:                 F
    Spec for all Nodes:           F
    Change Invalidates:           F
    Parent Facility:              "GeneralFacilityNode"
    Is Abstract:                  F
```

What is claimed is:

1. A computer system comprising:

a processor;

memory coupled to the processor; and an object-oriented software product stored in the memory, the software product configured to:

provide an object-oriented extensible class hierarchy, the class hierarchy comprising a first set of generic classes representing a plurality of generic facility types and a second set of generic classes representing generic named attribute types for the generic facility types;

provide a file that defines model facility types based on the first set of generic classes and that defines model named attribute types based on the second set of generic classes, wherein the file permits the addition of additional model facility types and additional model named attribute types without any modifications to the class hierarchy; and create facility instances from model facility types and named attribute instances from model named attribute types, wherein facility instances and named attribute instances are stored in memory and coupled in a facility network to simulate transport phenomenon using the facility instances and named attributes in a mathematical simulation of transport phenomenon.

2. The computer system of claim 1 wherein the transport phenomenon comprises one or more of momentum, energy, and mass transport within a subsurface hydrocarbon-bearing reservoir and between the subsurface hydrocarbon-bearing reservoir and one or more delivery locations at the earth's surface.

3. The computer system of claim 2 wherein the transport between a subsurface hydrocarbon-bearing reservoir and one or more of the delivery locations comprises one or more transport pathways, wherein the facility instances represent at least one of production and injection wells and one or more other facilities through which hydrocarbon fluids are transported between the subsurface reservoir and the delivery locations.

4. The computer system of claim 3 wherein the other facilities contained within the transport pathways comprise at least one facility selected from surface flowlines, manifolds, separators, valves, pumps, and compressors.

5. The computer system of claim 1 wherein the object-oriented software product comprises a graphical user interface whereby a user of the computer system defines the facility network.

6. The computer system of claim 1 comprising a graphical user interface configured to define the additional model named attribute types that extend the functionality of the computer system in a user-customizable manner.

7. The object-oriented software product of claim 1 wherein the object-oriented software is written in C++.

8. The computer system of claim 1 further comprising an object-oriented database.

9. A computer-implemented method of simulating transport phenomena in a facility network that models facilities used in the production of hydrocarbons, the method comprising the steps of:
building a model comprising a facility network, wherein the facility network comprises facility instances formed from model facility types based on a first set of generic classes and named attribute instances formed from model named attribute types based on a second set of generic classes, and wherein a data definitions file defines the model facility types and the model named attribute types, and the first set and second set of generic classes are part of a class hierarchy that is not modified by the addition of other model facility types and other model named attribute types to the data definitions file;
specifying values of the named attribute instances that are associated with one of the facility instances, wherein the specified values of the named attribute instances associated with the one of the facility instances model properties of one of the facilities used in the production of hydrocarbons from a reservoir;
using the facility instances and named attribute instances in a mathematical simulation of transport phenomena within the facility network as a function of time, wherein the facility instances and named attribute instances are organized to represent facilities used in the production of hydrocarbons from a reservoir; and
predicting the behavior of the facilities based on the mathematical simulation.

10. The method of claim 9 wherein the facility network is part of a larger simulation model, with the facility network configured to simulate the exchange of fluids with at least one other part of the simulation model.

11. The method of claim 10 wherein the simulation model comprises the facility network and a hydrocarbon-bearing formation.

12. A computer-implemented method of simulating transport phenomena in a model of a physical system comprising a hydrocarbon-bearing reservoir penetrated by a plurality of wells, the plurality of wells connected to surface facilities, the method comprising:
discretizing the model of the physical system into a plurality of volumetric cells, wherein each volumetric cell is modeled as a node, and adjacent nodes exchange fluid through connections between the nodes;
using facility instances created from model facility types and named attribute instances created from model named attribute types to model the nodes and connections in the portion of the discretized model that represents wells and surface facilities of the physical system, wherein a data definitions file defines model facility types based on a first set of generic classes and defines model named attribute types based on a second set of generic classes with the first set of generic classes and the second set of generic classes arranged in a class hierarchy that permits the addition of additional model facility types and additional model named attribute types without any modifications to the class hierarchy;
specifying geometric and transport properties for each node and connection;
specifying initial conditions for each node and connection;
simulating as a function of time the transport phenomena in the discretized physical system; and
predicting the behavior of the physical system based on the simulation.

13. A computer implemented method of modeling a hydrocarbon system comprising:
accessing an application on a computer system having a first set of generic classes and a second set of generic classes associated in a class hierarchy;
providing model facility types created from the first set of generic classes;
providing model named attribute types that are associated with at least one of the model facility types and created from the second set of generic classes,
providing a data definitions file to define model facility types and model named attribute types, wherein the addition of the additional model facility types and the additional model named attribute types does not modify the class hierarchy of the first set of generic classes and the second set of generic classes;
simulating transport phenomena in a hydrocarbon facility network with facility instances created from the model facility types and the named attributes instances created from the model named attribute types, wherein the hydrocarbon facility network represents facilities in the hydrocarbon system; and
evaluating the results of the simulation to manage operation of the hydrocarbon system.

14. The method of claim 13 wherein the simulation models fluid transport between a surface facility and a subsurface formation accessed by a well.

15. The method of claim 13 wherein the model facility types comprise model representations of one or more types of surface flowlines, manifolds, separators, valves, pumps, or compressors.

16. The method of claim 13 wherein the simulation models fluid transport between surface facilities and a subsurface formation accessed by a plurality of wells.

17. The method of claim 13 comprising coding the first set of generic classes representing the generic facility types and the second set of generic classes representing generic named attribute types prior to loading the application onto the computer system.

18. The method of claim 13 comprising:
creating facility instances from the model facility types by a simulator user; and
utilizing the facility instances to represent components of the hydrocarbon facility network for the simulation.

19. The method of claim 13 further comprising managing the hydrocarbon system based on the evaluation.

* * * * *